(12) United States Patent
Bartley et al.

(10) Patent No.: US 7,036,710 B1
(45) Date of Patent: May 2, 2006

(54) METHOD AND STRUCTURES FOR IMPLEMENTING IMPEDANCE-CONTROLLED COUPLED NOISE SUPPRESSOR FOR DIFFERENTIAL INTERFACE SOLDER COLUMN ARRAY

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/023,674

(22) Filed: Dec. 28, 2004

(51) Int. Cl.
*B23K 31/02* (2006.01)
*B23K 35/12* (2006.01)
*B23K 35/14* (2006.01)
(52) U.S. Cl. .............. 228/180.22; 228/245; 228/246; 228/56.3
(58) Field of Classification Search .............. None
See application file for complete search history.

(56) References Cited

U.S. PATENT DOCUMENTS

| | | | | |
|---|---|---|---|---|
| 3,744,129 A * | 7/1973 | Dewey, Jr. | .................. | 29/837 |
| 5,678,287 A * | 10/1997 | Smith et al. | ........... | 228/180.22 |
| 6,414,248 B1 * | 7/2002 | Sundstrom | .................. | 174/260 |
| 6,458,623 B1 * | 10/2002 | Goldmann et al. | ......... | 438/107 |
| 2003/0189083 A1 * | 10/2003 | Olsen | ........................ | 228/115 |

* cited by examiner

*Primary Examiner*—Lynne R. Edmondson
(74) *Attorney, Agent, or Firm*—Joan Pennington (57) ABSTRACT

A method and structures are provided for implementing an impedance-controlled coupled noise suppressor for a differential interface solder column array used to join a substrate to a circuit card. The impedance-controlled coupled noise suppressor structure includes a plurality of elongated through openings that are arranged in a predefined pattern with one or more of the through openings receiving a differential signal pair of solder columns. The elongated through openings have electrically conductive sidewalls and are electrically connected together. The predefined pattern of the elongated, electrically conductive through openings corresponds to a layout of solder columns. The solder columns are attached at opposite ends to a substrate and a circuit card. An electrical connection is provided between the impedance-controlled coupled noise suppressor structure and an image return current path of the circuit card.

9 Claims, 11 Drawing Sheets

Zo vs column diameter (for different cavity diameters (D) (mils)
1.0 mm column spacing)

METHOD AND STRUCTURES FOR IMPLEMENTING IMPEDANCE-CONTROLLED COUPLED NOISE SUPPRESSOR FOR DIFFERENTIAL INTERFACE SOLDER COLUMN ARRAY

FIELD OF THE INVENTION

The present invention relates generally to solder interconnection structures and, more particularly, to a method and structures for implementing impedance-controlled coupled noise suppressor for a differential interface solder column array.

DESCRIPTION OF THE RELATED ART

In electronics systems there are various electronic components that require connection to other electronic components or to other levels of packaging. Examples include mounting of integrated circuit chips to a metalized substrate, multilayer ceramic substrate (MLC), laminate organic substrate, glass ceramic substrate, card (direct-chip-attach, DCA), and any substrate made of composite materials meeting thermal and mechanical properties. A second level surface mount technology, such as, a column grid array (CGA) or a ball grid array (BGA) typically is used to form an interconnection between a circuit board and an electronic module assembly such as a chip connected to a MLC.

The term ball grid arrays (BGAs) refers to a broad class of microelectronic substrate assemblies that are connected to the board/card with an array of solder balls. The use of solder to join materials such as components of an electronic structure is well known in the art. First interconnections formed by joining solder balls to a substrate assembly create the BGA. The BGA is subsequently joined to the card during assembly. Substantial differences in the thermal coefficient of expansion (TCE) can exist between the board and the substrate, as is the case when the substrate is made from a ceramic material, and the board is made from an epoxy-glass composite, for example, FR4. During thermal cycling (on-off cycles), such TCE differences cause plastic deformation of the solder ball interconnections. Accumulation of plastic strain with repeated thermal cycling ultimately leads to fatigue failure of the interconnections between the ceramic substrate and the board.

The actual fatigue life of a BGA decreases with increasing array size. Also, for a given array size, the fatigue life of a BGA is a function of the materials that comprise the substrate, board, and interconnections, and also the interconnection structure. The present trend towards higher-powered packages, coupled with higher I/O counts, and larger interconnection arrays, creates a need for interconnections with improved fatigue life. Using solder column arrays instead of ball arrays provides desired improvement in fatigue life by allowing the interconnection length to increase with the enhancement in fatigue life in this case being due to the inverse relationship between interconnection length and accumulated plastic strain during thermal cycling.

Although solder column parts with 87 mils (0.087 inch) or about 2.2 millimeters (mm) tall columns are 10 times more reliable than ball grid arrays, some applications are being targeted toward smaller columns due to the added noise parasitic of the longer columns. The shorter column, typically 10 mils tall or less, is stiffer and does not bend as much as the longer column during the stress introduced by heating materials with different coefficients of thermal expansion, for example, ceramic substrates on FR4 cards or boards. A significant disadvantage of the solder column attach over the solder ball attach is the electrical noise coupling between adjacent solder columns.

U.S. patent application Ser. No. 10/703,353 to Bartley et al., filed Nov. 7, 2003 and assigned to the present assignee discloses a method and structure for implementing a column attach coupled noise suppressor for a solder column structure of the type used to join a substrate to a circuit card. The electrical noise suppressor structure includes a plurality of elongated through openings that are arranged in a predefined pattern. The elongated through openings have electrically conductive sidewalls and are electrically connected together. The predefined pattern of the elongated, electrically conductive through openings corresponds to a layout of solder columns. The solder columns are attached at one end to either a substrate or a circuit card and are inserted through the elongated through openings of the electrical noise suppressor structure, spaced apart from the electrically conductive sidewalls. Then the solder columns are attached at the other end to the other one of the substrate or circuit card.

The subject matter of the above-identified patent application is incorporated herein by reference.

While the above-identified patent application provides significant improvements over conventional arrangements, additional problems remain. For example, when signals pass through a solder column, the return current carried with the signal must travel through a nearby reference column. With respect to differential interfaces, a standard solder column structure creates a geometry in which all surrounding columns can affect a single victim column equally. This results in unwanted coupling between signals that should not have any affinity. One would find an advantage in being able to use a solder column package for reliability with which he could reduce unwanted coupled noise, while still reference differential signals to their compliments.

Also, typically when signals pass through a solder column, the signals experience an impedance discontinuity, which can affect the signal quality. When printed circuit card wiring escapes from modules, the space between the through-vias in the module pin field limit the wireability of the card. In some cases, different trace widths are required for escapes and for wiring outside the pin field in order to escape all the signals in the given number of layers. If one was able to remove some of the through vias in the module pin field, wireability could be improved.

A need exists for an effective mechanism to implement an impedance-controlled coupled noise suppressor for a differential interface solder column array with the reliability of longer solder columns, for example, 87 mils tall columns.

SUMMARY OF THE INVENTION

Principal objects of the present invention are to provide a method and structures for implementing an impedance-controlled coupled noise suppressor for a differential interface solder column array for example, used as a column grid array (CGA) to make second level solder connections in electronic components such as joining a substrate to a circuit card. Other important objects of the present invention are to provide such impedance-controlled coupled noise suppressor for a differential interface solder column array substantially without negative effect and that overcome some of the disadvantages of prior art arrangements.

In brief, a method and structures are provided for implementing an impedance-controlled coupled noise suppressor for a differential interface solder column array, for example, of the type used to join a substrate to a circuit card. The impedance-controlled coupled noise suppressor structure includes a plurality of elongated through openings that are arranged in a predefined pattern with one or more of the through openings receiving a differential signal pair of solder columns. The elongated through openings have electrically conductive sidewalls and are electrically connected together. The predefined pattern of the elongated, electrically conductive through openings corresponds to a layout of solder columns. The solder columns are attached at one end to either a substrate or a circuit card and are inserted through the elongated through openings of the impedance-controlled coupled noise suppressor structure, spaced apart from the electrically conductive sidewalls. Then the solder columns are attached at another end to the other one of the substrate or circuit card.

In accordance with features of the invention, the impedance-controlled coupled noise suppressor enables the use of long solder columns with minimized coupled noise between adjacent differential pairs of solder columns. The impedance-controlled coupled noise suppressor enables a differential signal pair to propagate together and also return currents flowing in reference planes around the differential signal pair. The impedance-controlled coupled noise suppressor also enables controlled impedance for single signals and minimized coupled noise between adjacent solder columns. An electrical connection is provided between the impedance-controlled coupled noise suppressor structure and an image return current path of the circuit card.

In one embodiment, the impedance-controlled coupled noise suppressor structure is formed by an electrically insulative member including a plurality of metal plated vias defining the predefined pattern of the elongated through openings and the metal plated vias are electrically connected together by a conductive layer carried by the electrically insulative member.

In another embodiment, the impedance-controlled coupled noise suppressor structure is formed by a grid of an electrically conductive material having a predefined depth defining the predefined pattern of the elongated through openings and the grid of electrically conductive material is coated with an electrically non-conductive material.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method and structures are provided for implementing impedance-controlled coupled noise suppressor for a differential interface solder column array arranged, for example, as a column grid array (CGA) or in various other array patterns, to make second level solder connections such as for joining a substrate to a circuit card. The impedance-controlled coupled noise suppressor structures of the preferred embodiments enable the use and reliability of longer solder columns, for example, 87 mils (0.087 inch) tall solder columns with substantially comparable electrical advantages of ball grid arrays. The impedance-controlled coupled noise suppressor structures of the preferred embodiments isolate each differential signal pair of solder columns in a solder column package from other solder columns on the package.

Figure 1:
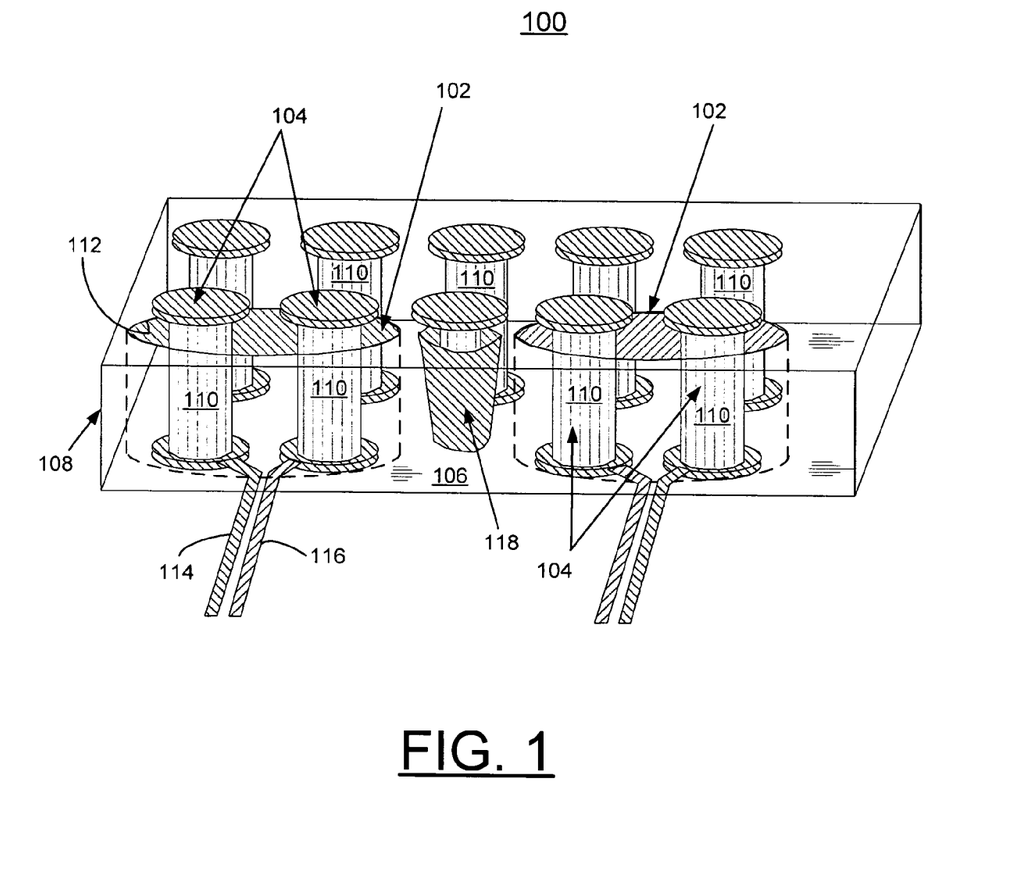
FIG. 1 is an isometric view not to scale with interior details shown in dotted line illustrating a structure and method for implementing an impedance-controlled coupled noise suppressor for a differential interface solder column array used to join a substrate to a circuit card after assembly in accordance with one preferred embodiment.

Having reference now to the drawings, in FIG. 1, there is shown an impedance-controlled coupled noise suppressor structure generally designated by the reference character 100 for use with differential signal pairs of solder columns in accordance with the preferred embodiment.

Impedance-controlled coupled noise suppressor structure 100 is an electrically insulative structure including a plurality of elongated, electrically conductive through openings or plated vias generally designated by the reference character 102, each receiving and isolating a respective differential signal pairs of solder columns generally designated by the reference character 104. The plated vias 102 are electrically connected together into one common electrical structure by a conductive layer or mesh indicated by reference character 106 that is contained within an electrically non-conductive or insulative member generally designated by the reference character 108 defining the impedance-controlled coupled noise suppressor structure 100 in accordance with the preferred embodiment. It should be understood that various other structures or methods could be used to electrically connect the plated vias 102 together.

Impedance-controlled coupled noise suppressor structure 100 is formed by the insulative member 108 with openings or through holes formed, for example, punched, laser drilled, or etched through the electrically insulative member 108 in a predefined pattern and then an interior through hole sidewall is plated with a continuous layer of a metal to provide the elongated, plated vias 102 corresponding to a predefined pattern of a plurality of elongated solder columns 108, for example, present as an array. The conductive layer or mesh 106 is carried on or within the electrically insulative member 108 for electrically connecting the metal plated through openings 102. Solder column 110 is, for example, a column of solder wire used to effect the connection between a ceramic substrate and a printed circuit board by a solder technique such as column grid array (CGA) attach technique.

An electrically conductive sidewall 112 of each elongated opening or plated via 102 is formed of an electrically conductive material selected from the group including, for example, copper, titanium, nickel, conductive doped silicon, platinum, palladium, rhodium, aluminum, tantalum, tungsten and titanium-tungsten. The electrically conductive sidewall 112 of each elongated, plated via 102 is deposited, for example, by conventional sputtering, evaporation, or chemical vapor deposition (CVD) processes to provide a very thin metal sidewall layer sufficient to provide electrical conductivity. A pair of electrically conductive traces 114, 116 carried by an associated printed circuit board (not shown) optionally is connected to respective solder columns 110 of the differential signal pair 104. A defined solder column 110 surrounded by an electrically conductive shield 118 functions as an image return current path to an associated printed circuit board.

Impedance-controlled coupled noise suppressor structure 100 of a first preferred embodiment is used to isolate each differential pair 104 of solder columns 110 in the solder column package from the other solder column pairs 104 on the package. This structure 100 is used to significantly reduce the coupled noise between adjacent pairs 104, and allows for a signal and its differential compliment to propagate together, as well as return currents flowing in the reference planes around the pair. A long solder column 110 can be used allowing for the reliability improvement without the impact of the added adjacent column coupled noise. The electrically conductive traces 114, 116 optionally provided with the noise suppressor structure 100 can replace, for example, some of the otherwise needed wiring and through vias in a module pin field in an associated circuit card.

Each differential signal pair 104 advantageously is isolated, eliminating coupled noise from its nearest neighbors by the impedance-controlled coupled noise suppressor structure 100. The differential column structure allows the return current a continuous path, in the shield 112 and in the signal compliment solder column 110 of the differential signal pair 104. One possible method of creating the common electrical structure of the impedance-controlled coupled noise suppressor structure 100 is to partially drill a hole in the structure 100, and allow particular solder columns 110 assigned to the reference conductor to contact the structure 100 upon insertion.

By using the impedance-controlled coupled noise suppressor structure 100, one can create a continuous return current path without having to drill through vias for all the reference ground or reference voltage columns 110. In this way, more wiring channels will be available, reducing the overall number of required card layers, or allowing a designer to escape wider wires from the module pin field.

Solder column 110 is, for example, at least 87 mils tall and has a selected diameter, for example, from a range of about 10 mils (0.010 inch) to 25 mils (0.025 inch). The insulated structure 108 is an electrically nonconductive material, for example, a circuit card dielectric material, such as FR4, or ceramic dielectric. The elongated, electrically conductive through holes or plated vias 102 have a selected diameter for receiving the differential signal pair 104 of solder columns 110 spaced apart from the conductive sidewalls 112, for example, from about 45 mils to about 60 mils in diameter.

The solder columns 110 attached at one end to a substrate are inserted through the elongated, electrically conductive openings 102 of the impedance-controlled coupled noise suppressor structure 100, spaced apart from the electrically conductive sidewalls 112. Then the solder columns 108 are attached at the other end to a circuit card. It should be understood that solder columns 110 do not need to be circular in cross-section. It should be understood that the impedance-controlled coupled noise suppressor structure 100 can be used with solder columns 108 having square or other cross-sections, for example, as required by load conditions and available substrate area.

It should be understood that the solder columns 110 alternatively are first attached at one end to the circuit card, then after being inserted through the elongated, electrically conductive openings 102 of the impedance-controlled coupled noise suppressor structure 100 the solder columns 110 are attached at the other end to the substrate.

Impedance-controlled coupled noise suppressor structure 100 of a first preferred embodiment allows differential signaling without disrupting the affinity of the differential pair 104. Furthermore, the geometry of the impedance-controlled coupled noise suppressor structure 100 can be constructed to have an impedance which is comparable to standard package impedances, such as, on the order of 100 ohms differential.

Figure 2:
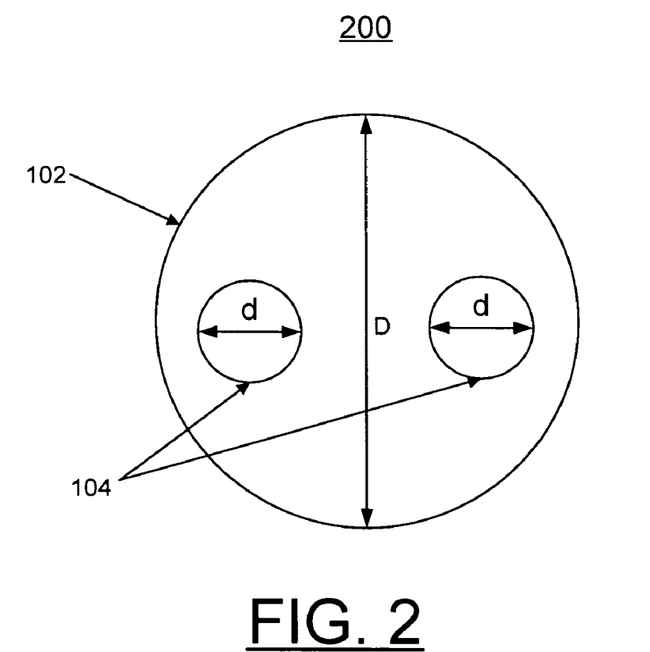
FIG. 2 is a schematic view illustrating a twin-axial structure of the impedance-controlled coupled noise suppressor structure of FIG. 1.
Figure 3:
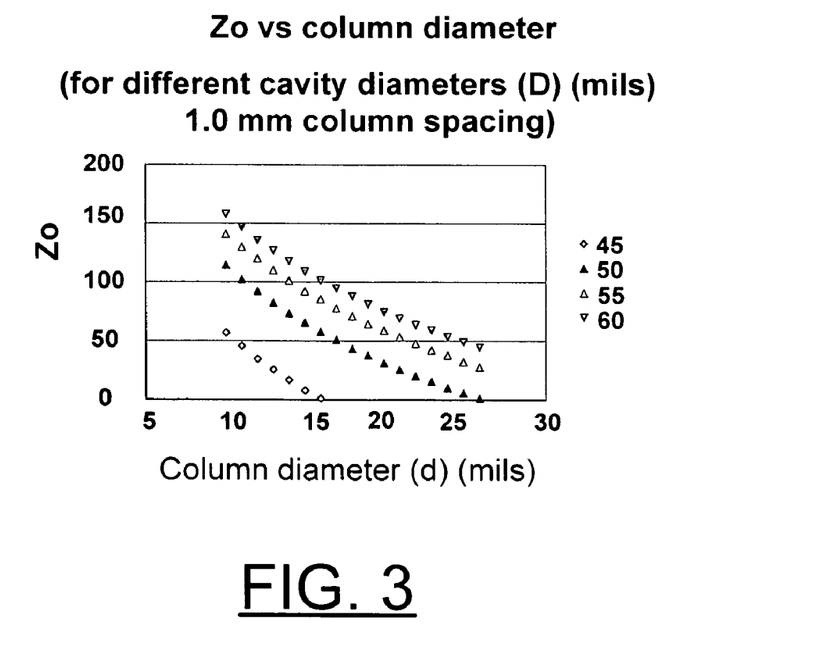
FIG. 3 is a chart illustrating impedance versus column diameter for multiple cavity sizes of the illustrated twin-axial structure of FIG. 2.

Referring now to FIGS. 2 and 3, an exemplary impedance-controlled coupled noise suppressor structure generally designated by reference character 200 is schematically shown in FIG. 2. The illustrated twin-axial structure 200 of the impedance-controlled coupled noise suppressor structure 100 includes a differential pair 104 within a plated via 102 having a diameter D. Each solder column 110 of the differential pair 104 has a diameter of d, for example between 10 mils and 25 mils.

FIG. 3 shows impedance versus column diameter (d), for 4 possible cavity sizes (D) on a 1 mm solder column grid. As shown, impedance decreases as column diameter increases and higher impedance results in increased cavity sizes for the illustrated twin-axial structure 200 of FIG. 2.

Figure 4A:
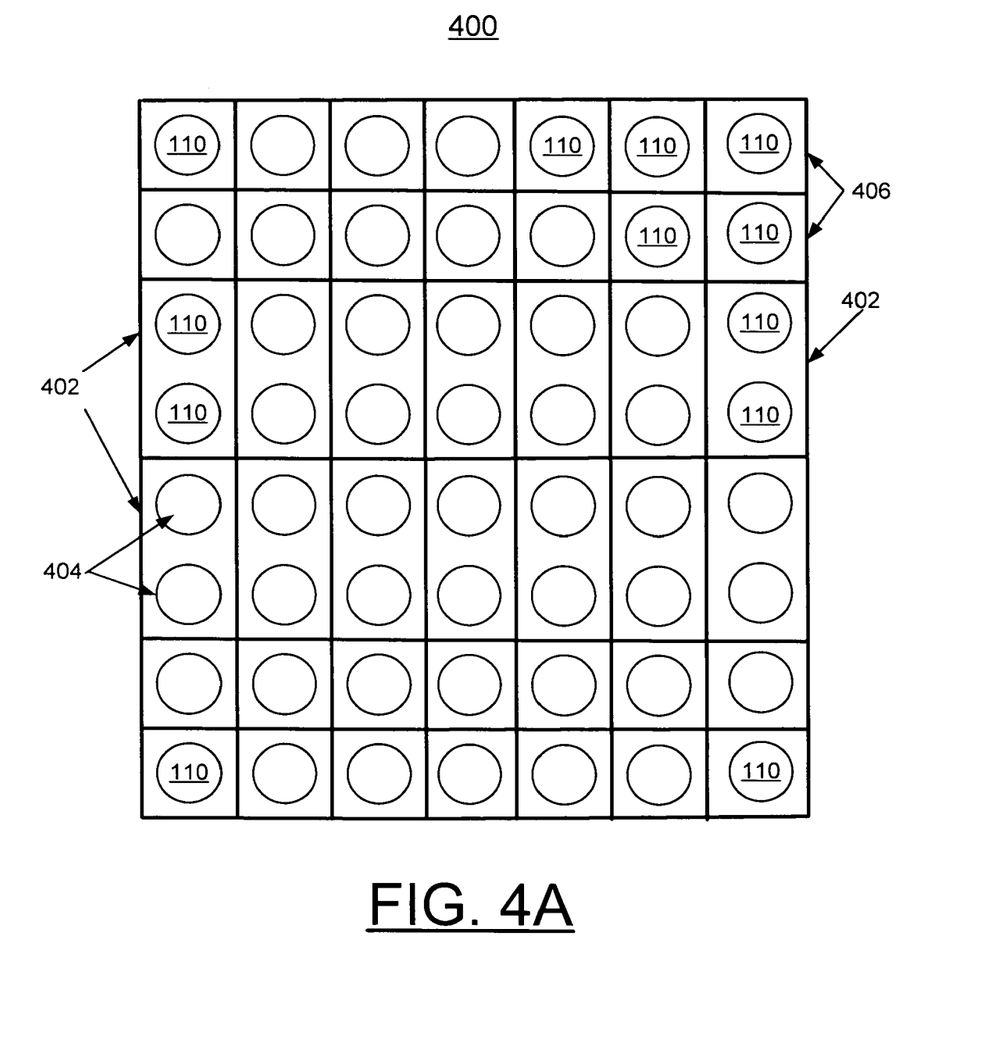
FIGS. 4A, 4B, and 4C illustrate another structure for implementing an impedance-controlled coupled noise suppressor for a differential interface solder column array in accordance with another preferred embodiment.
Figure 4B:
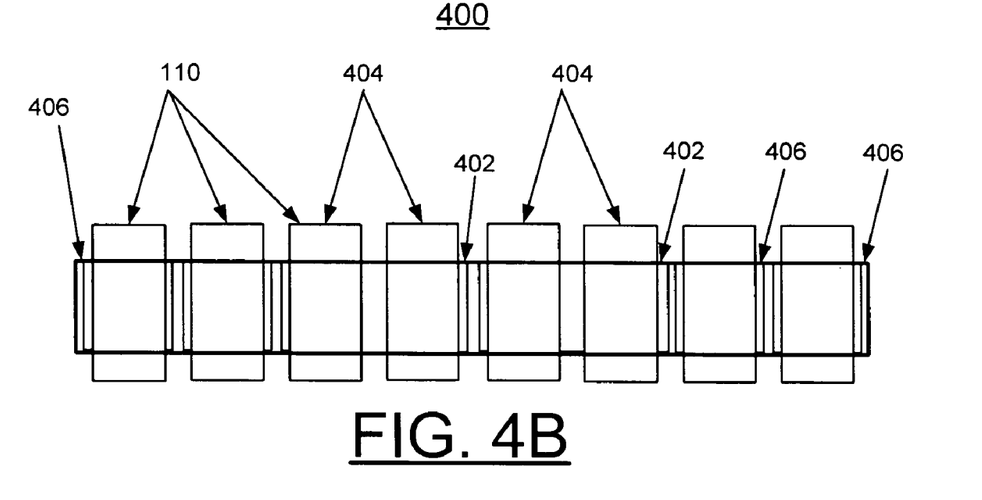
Figure 4C:
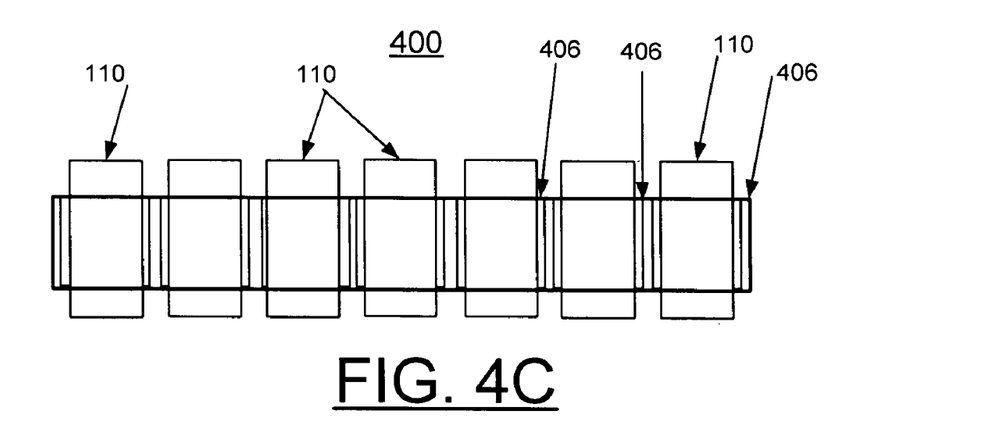

Referring now to FIGS. 4A, 4B and 4C, there is shown another structure for implementing impedance-controlled coupled noise suppressor generally designated by reference character 400 in accordance with another preferred embodiment. The impedance-controlled coupled noise suppressor structure 400 includes a plurality of rectangular cells 402, each receiving differential signal pairs 404 formed of an electrically conductive material or electrically conductive materials forming a fence like electrically conductive structure with a predefined depth to isolate each differential signal pair 404 from other differential signal pairs 404 and a plurality of cells 406 to isolate also a single solder column 110 from other solder columns 110. The electrically conductive materials, for example, are coated with an electrically non-conductive material capable of withstanding typical eutectic solder attach temperatures.

The electrically conductive materials defining rectangular cells 402 and cells 406 are selected from the group including, for example, copper, titanium, nickel, conductive doped silicon, platinum, palladium, rhodium, aluminum, tantalum, tungsten and titanium-tungsten. The insulated coating material can be implemented, for example, with Teflon or Liquid Crystal Polymers or other electrically non-conductive material that would withstand the solder attach temperatures the impedance-controlled coupled noise suppressor structure 400 would typically encounter.

In accordance with features of the preferred embodiment, various methods can be used for electrically connecting the differential coupled noise suppressor structures 100, 400 to a desired image return current path (i.e. GND) on associated substrates and packages in typical embodiments of the invention.

Figure 4D:
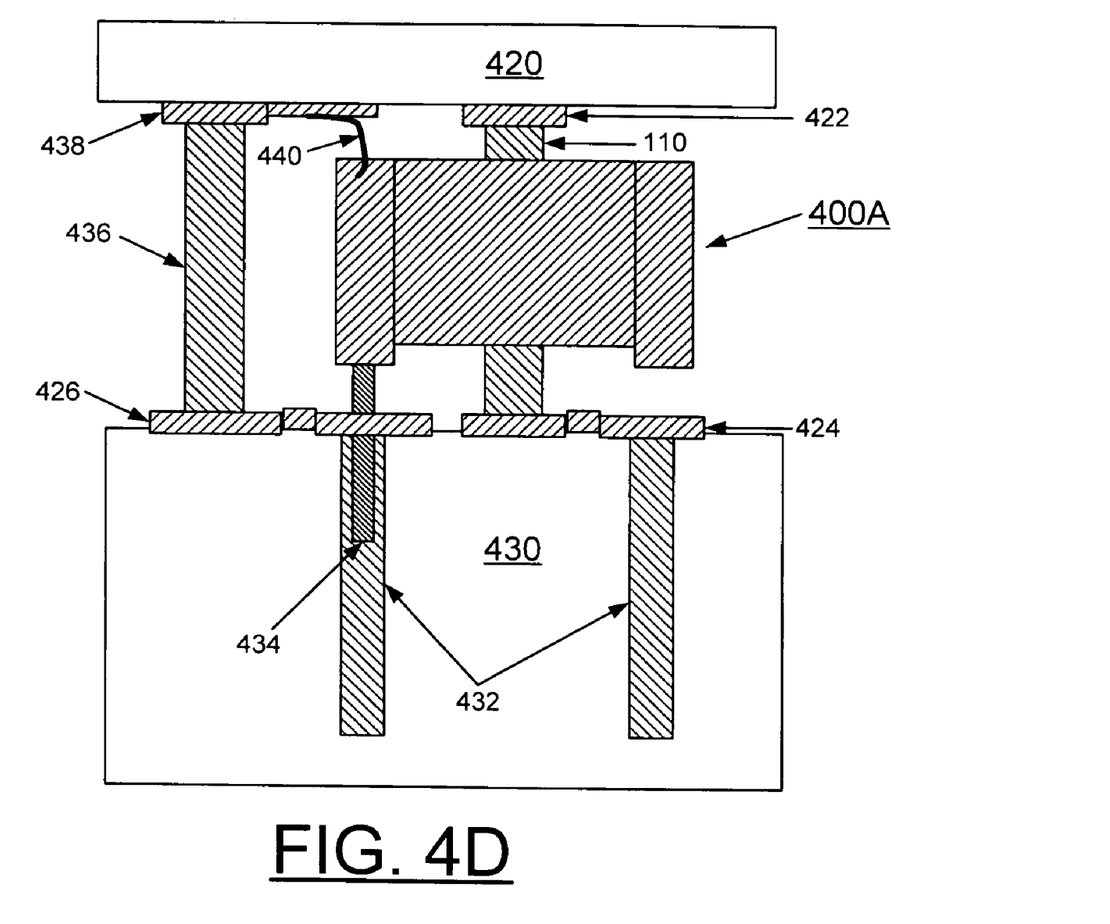
FIG. 4D illustrates exemplary connection arrangements to image return current paths of an associated substrate and an associated printed circuit card with a fragmentary detail of the impedance-controlled coupled noise suppressor of FIGS. 4A, 4B, and 4C in accordance with preferred embodiments.

Referring also to FIG. 4D, there are shown exemplary connection arrangements to image return current paths of an associated substrate 420 and an associated printed circuit card 430 in accordance with preferred embodiments. A fragmentary detailed sectional portion of the impedance-controlled coupled noise suppressor generally designated by reference character 400A is illustrated in FIG. 4D. A solder column 110 within the impedance-controlled coupled noise suppressor 400A is electrically connected to a connection pad 422 carried by the substrate or module 420 and is electrically connected to a first dog bone connection pad 424 carried by the printed circuit card 430. A second dog bone connection pad 426 carried by the printed circuit card 430 is connected between a card via 432 by a pin-in-hole connection 434 and the impedance-controlled coupled noise suppressor 400A. A solder column 436 with an extension connection pad 438 to the substrate or module 420 also connects to the second dog bone connection pad 426 and to the printed circuit card 430. A spring member 440 extending between the impedance-controlled coupled noise suppressor 400A and the extension connection pad 438 to the substrate or module 420 provides a return current path.

Figure 5:
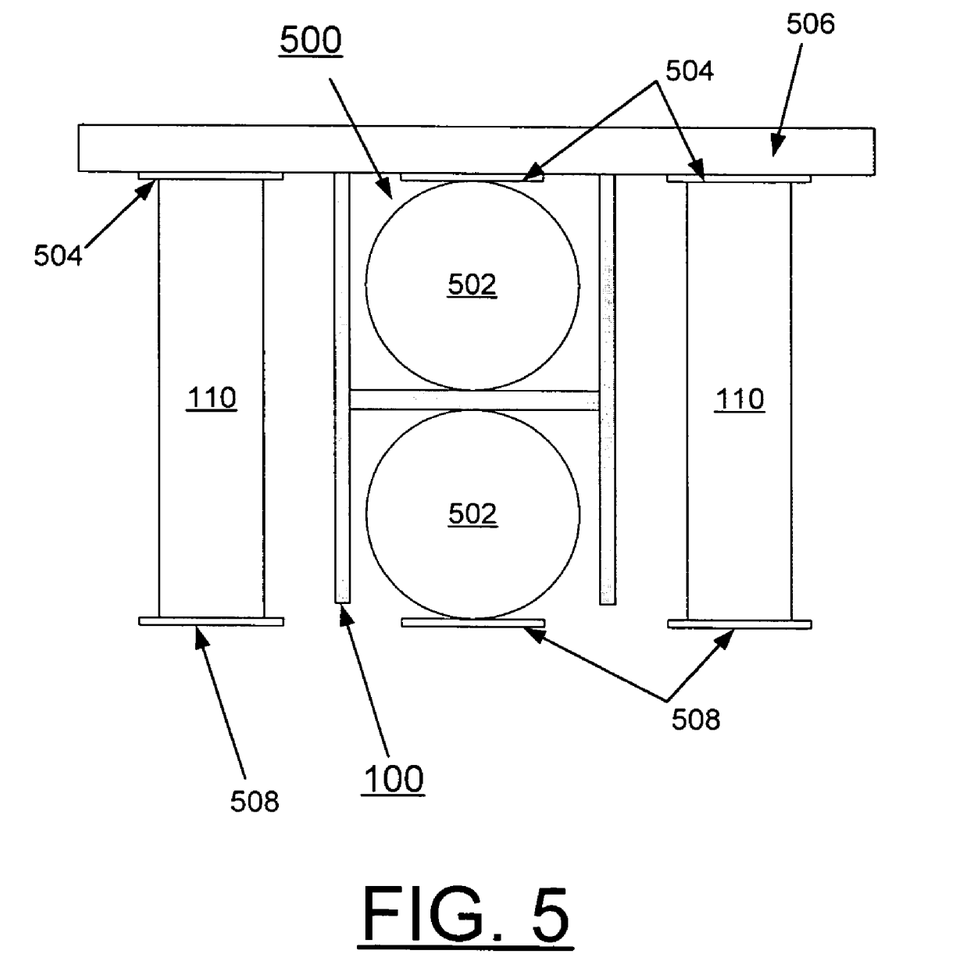
FIGS. 5 and 6 illustrates a first and a second respective exemplary return current or image return current path column for use with the impedance-controlled coupled noise suppressor for a differential interface solder column array of FIG. 1 and of FIGS. 4A, 4B, and 4C in accordance with another preferred embodiments.
Figure 6:
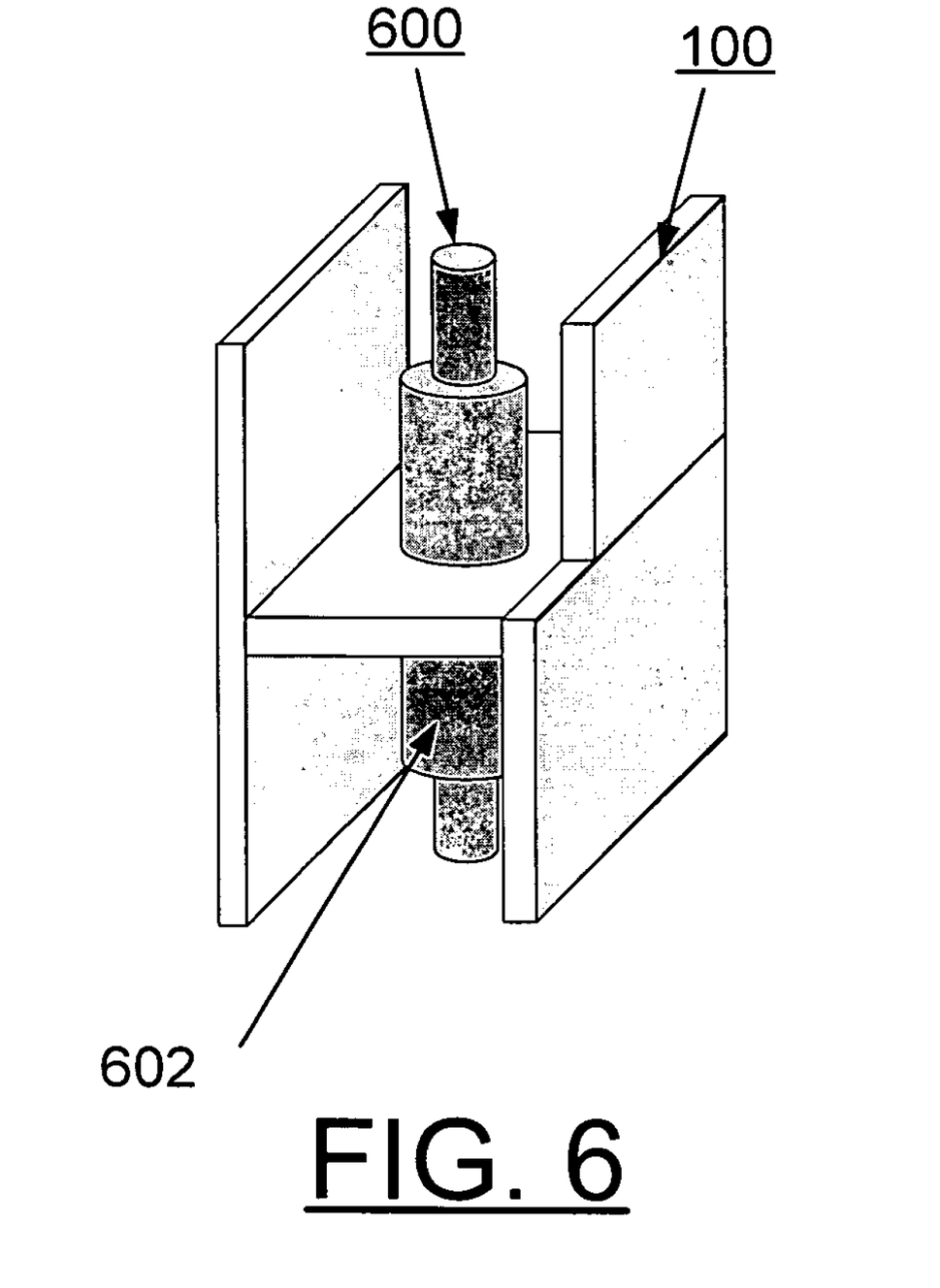

FIGS. 5 and 6 illustrates a first and a second respective exemplary return current or image return current path column 500, 600 for use with the impedance-controlled coupled noise suppressor structures 100, 400 of the preferred embodiments. In a first method of FIG. 5, the image return current path column is omitted from the column array, and a solder ball substitution 502 is used in that location in the structure 100. The image return current path column 500 includes a solder ball substitution 502 for the image return current path column connecting a substrate pad 504 of an associated substrate 506 with a printed circuit board pad 508.

In FIG. 6, the image return current path column 600 is defined by a substitution pogo-pin structure 602 for the image return current path column for use with the impedance-controlled coupled noise suppressor structures 100, 400 of the preferred embodiments. A selected one of multiple conventional pogo-pin structures 602 can be used.

Figure 7:
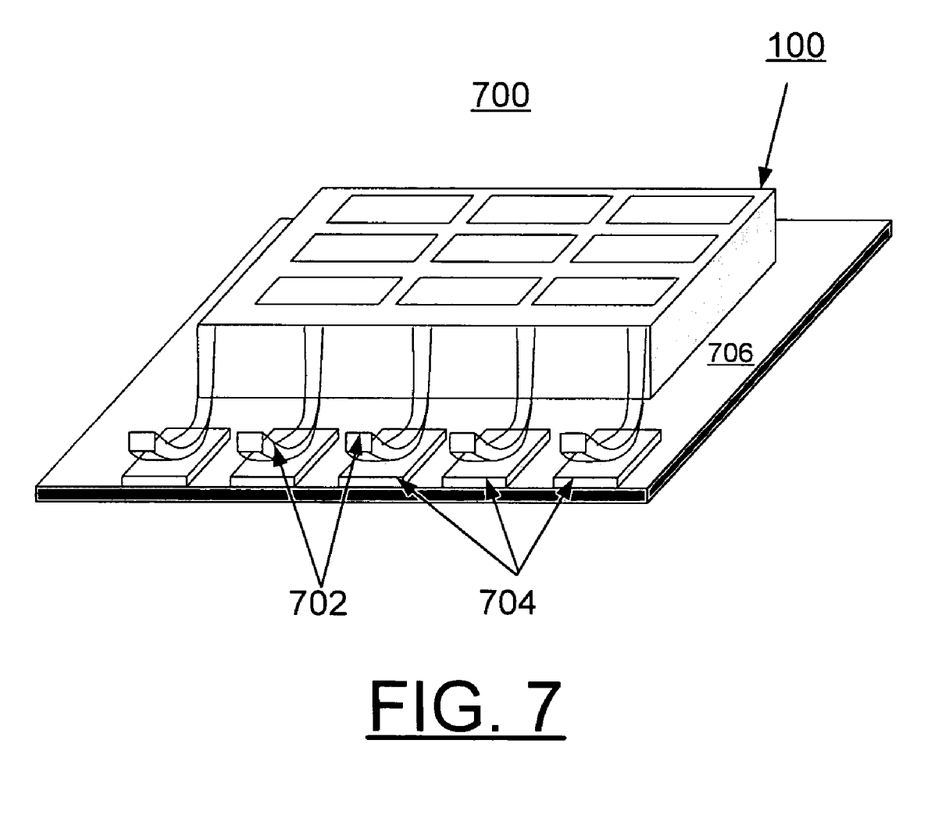
FIGS. 7, 8 and 9 illustrates a plurality of respective exemplary connection arrangements to image return current path pads for use with the impedance-controlled coupled noise suppressor for a differential interface solder column array of FIG. 1 and of FIGS. 4A, 4B, and 4C in accordance with another preferred embodiments.
Figure 8:
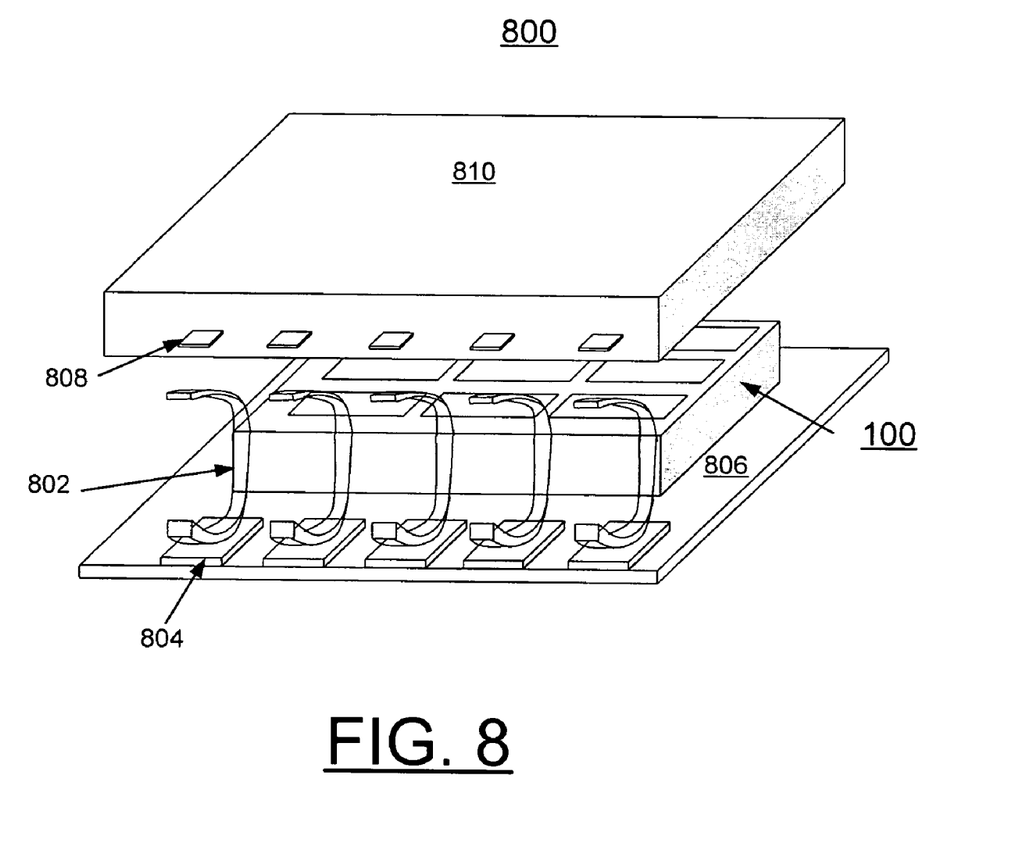
Figure 9:
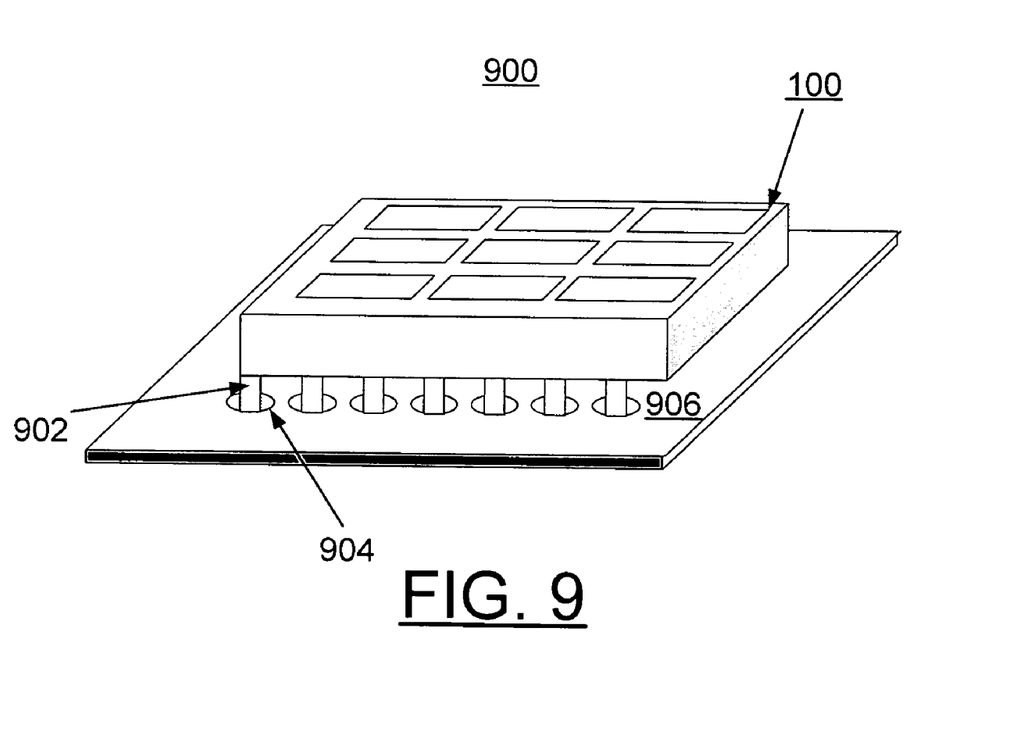

FIGS. 7, 8 and 9 illustrates a plurality of respective exemplary connection arrangements of image return current path pads generally designated by a respective reference character 700, 800, 900 for use with the impedance-controlled coupled noise suppressor structures 100, 400 in accordance with another preferred embodiments.

Referring to FIG. 7, the illustrated connection arrangement 700 illustrates the use of J-lead pins 702 which are attached to the exterior of impedance-controlled coupled noise suppressor structure 100, and connected to pads 704 which exist on the PCB 706.

Referring to FIG. 8, the illustrated connection arrangement 800 illustrates the use of J-lead pins 802 which are attached to the exterior of impedance-controlled coupled noise suppressor structure 100, and connected to a plurality of pads 804 which exist on the PCB 806 and a plurality of pads 808 on a substrate 810. The J-leads pins 702, 802 may be soldered to the pads.

Referring to FIG. 9, the illustrated connection arrangement 900 illustrates the use of pins 902 which are attached to the impedance-controlled coupled noise suppressor structure 100 and are inserted into corresponding vias 904 on a PCB 906. These pin connections also may be soldered.

Figure 10:
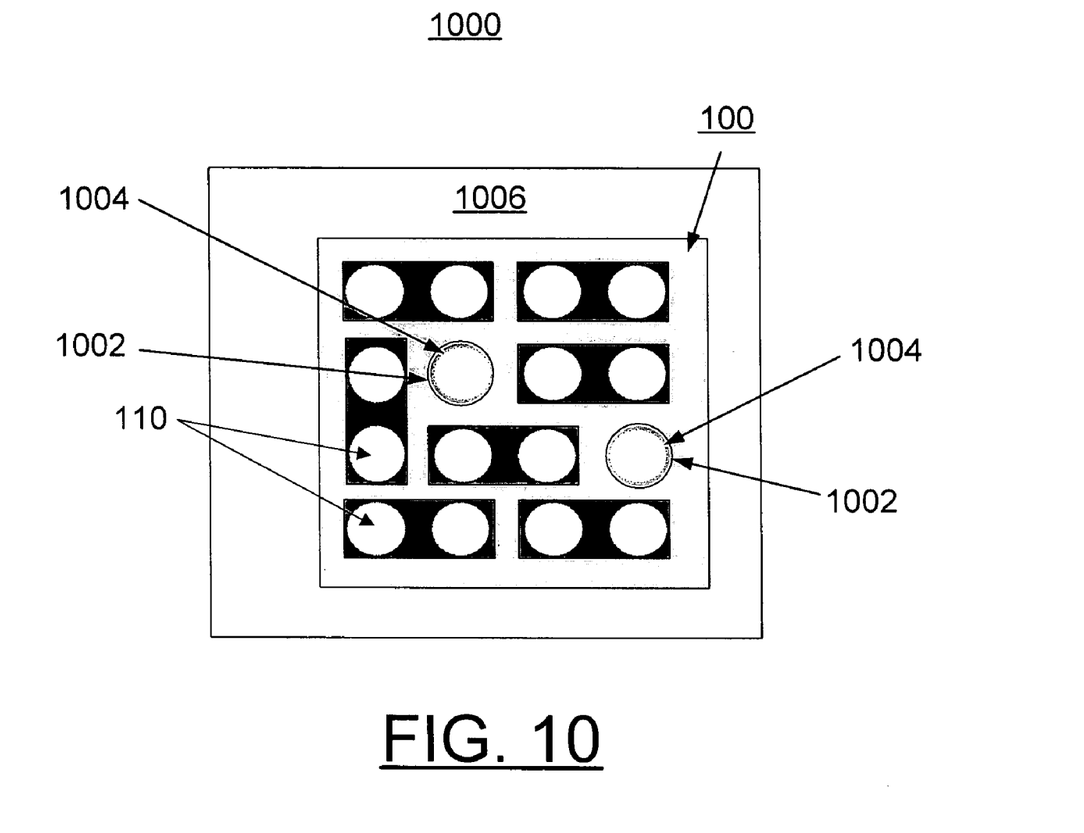
FIG. 10 illustrates another exemplary connection arrangement to image return current path pads for use with the impedance-controlled coupled noise suppressor for a differential interface solder column array of FIG. 1 and of FIGS. 4A, 4B, and 4C in accordance with another preferred embodiments.

FIG. 10 illustrates another exemplary connection arrangement generally designated by a respective reference character 1000 for use with the impedance-controlled coupled noise suppressor structures 100, 400 in accordance with another preferred embodiments. The illustrated connection arrangement 1000 illustrates the use of one or more selected compartments 1002 where the image return current path column would be located are left filled in during the manufacturing of the noise suppressor structure 100. Then a drill is used to create holes 1004 in the structure 100 which can be used for an electrical connection to the image return current path.

While the present invention has been described with reference to the details of the embodiments of the invention shown in the drawing, these details are not intended to limit the scope of the invention as claimed in the appended claims.

What is claimed is:

1. A method for implementing an impedance-controlled coupled noise suppressor for a differential interface solder column array comprising the steps of:

providing an impedance-controlled coupled noise suppressor structure having a plurality of elongated through openings arranged in a predefined pattern with one or more of the through openings receiving a differential signal pair of solder columns; said elongated through openings having electrically conductive sidewalls and being electrically connected together; said predefined pattern of the elongated, electrically conductive through openings corresponding to a layout of solder columns;

inserting said solder columns through the elongated through openings of the impedance-controlled coupled noise suppressor structure, spaced apart from the electrically conductive sidewalls with said solder columns being attached at one end to one of the substrate or the circuit card;

attaching said solder columns at another end to the other one of the substrate or the circuit card;

providing an electrical connection between said impedance-controlled coupled noise suppressor structure and an image return current path of the circuit card;

providing an electrical connection between said impedance-controlled coupled noise suppressor structure and a return current path of the substrate; and wherein the steps of providing an electrical connection includes the steps of providing a solder connection.

2. A method for implementing an impedance-controlled coupled noise suppressor for a differential interface solder column array comprising the steps of:

providing an impedance-controlled coupled noise suppressor structure having a plurality of elongated through openings arranged in a predefined pattern with one or more of the through openings receiving a differential signal pair of solder columns; said elongated through openings having electrically conductive sidewalls and being electrically connected together; said predefined pattern of the elongated, electrically conductive through openings corresponding to a layout of solder columns;

inserting said solder columns through the elongated through openings of the impedance-controlled coupled noise suppressor structure, spaced apart from the electrically conductive sidewalls with said solder columns being attached at one end to one of the substrate or the circuit card;

attaching said solder columns at another end to the other one of the substrate or the circuit card;

providing an electrical connection between said impedance-controlled coupled noise suppressor structure and an image return current path of the circuit card;

providing an electrical connection between said impedance-controlled coupled noise suppressor structure and a return current path of the substrate; and wherein the steps of providing an electrical connection includes the steps of providing an electrically conductive spring pin and pad connection.

3. A method for implementing an impedance-controlled coupled noise suppressor for a differential interface solder column array comprising the steps of:

providing an impedance-controlled coupled noise suppressor structure having a plurality of elongated through openings arranged in a predefined pattern with one or more of the through openings receiving a differential signal pair of solder columns; said elongated through openings having electrically conductive sidewalls and being electrically connected together; said predefined pattern of the elongated, electrically conductive through openings corresponding to a layout of solder columns;

inserting said solder columns through the elongated through openings of the impedance-controlled coupled noise suppressor structure, spaced apart from the electrically conductive sidewalls with said solder columns being attached at one end to one of the substrate or the circuit card;

attaching said solder columns at another end to the other one of the substrate or the circuit card;

providing an electrical connection between said impedance-controlled coupled noise suppressor structure and an image return current path of the circuit card;

providing an electrical connection between said impedance-controlled coupled noise suppressor structure and a return current path of the substrate; and wherein the steps of providing an electrical connection includes the steps of providing an electrically conductive pin and via connection.

4. A structure for implementing an impedance-controlled coupled noise suppressor for a differential interface solder column array of the type used to join a substrate to a circuit card comprising:

an impedance-controlled coupled noise suppressor structure having a plurality of elongated through openings arranged in a predefined pattern corresponding to a layout of solder columns; one or more of said through openings arranged for receiving a differential signal pair of said solder columns;

said elongated through openings having electrically conductive sidewalls and being electrically connected together;

said solder columns received through said elongated through openings of the impedance-controlled coupled noise suppressor structure spaced apart from the electrically conductive sidewalls; said solder columns having opposed ends being respectively attached to the substrate and the circuit card; and an electrical connection between said impedance-controlled coupled noise suppressor structure and an image return current path of the circuit card;

said electrical connection between said impedance-controlled coupled noise suppressor structure and said image return current path of the circuit card being formed by a selected one or combination of a solder connection, a spring pin and pad connection, a pin and via connection.

5. A structure for implementing an impedance-controlled coupled noise suppressor as recited in claim 4 wherein said electrical noise suppressor structure includes an electrically insulative member including a plurality of metal plated vias defining said predefined pattern of said elongated through openings and said metal plated vias being electrically connected together by an electrically conductive layer carried by said electrically insulative member.

6. A structure for implementing an impedance-controlled coupled noise suppressor as recited in claim 4 wherein said electrical noise suppressor structure includes a grid of an electrically conductive material having a predefined depth defining said predefined pattern of said elongated through openings; and said grid of said electrically conductive material being coated with an electrically non-conductive material.

7. A structure for implementing an impedance-controlled coupled noise suppressor as recited in claim 4 wherein said electrically conductive sidewalls are formed of an electrically conductive material selected from the group of copper, titanium, nickel, conductive doped silicon, platinum, palladium, rhodium, aluminum, tantalum, tungsten and titanium-tungsten.

8. A structure for implementing an impedance-controlled coupled noise suppressor as recited in claim 4 further includes an electrical connection between said impedance-controlled coupled noise suppressor structure and a return current path of the substrate.

9. A structure for implementing a column attach coupled noise suppressor as recited in claim 8 wherein said electrical connection between said impedance-controlled coupled noise suppressor structure and a return current path of the substrate is formed by a selected one or combination of a solder connection, a spring pin and pad connection, a pin and via connection.

* * * * *